US006495010B2

(12) United States Patent
Sferlazzo

(10) Patent No.: US 6,495,010 B2
(45) Date of Patent: Dec. 17, 2002

(54) DIFFERENTIALLY-PUMPED MATERIAL PROCESSING SYSTEM

(75) Inventor: Piero Sferlazzo, Marblehead, MA (US)

(73) Assignee: Unaxis USA, Inc., St. Petersburg, FL (US)

( * ) Notice: Subject to any disclaimer, the term of this patent is extended or adjusted under 35 U.S.C. 154(b) by 0 days.

(21) Appl. No.: 09/840,393

(22) Filed: Apr. 23, 2001

(65) Prior Publication Data

US 2002/0003086 A1 Jan. 10, 2002

Related U.S. Application Data

(60) Provisional application No. 60/266,114, filed on Feb. 2, 2001.

(51) Int. Cl.[7] .................. C23C 14/35; C23C 16/00; B05C 11/00; B05D 1/00; H05H 1/24
(52) U.S. Cl. .................. 204/298.27; 204/192.11; 204/192.12; 204/298.03; 204/298.04; 204/298.11; 427/8; 427/569; 427/255.5; 118/730; 118/712; 118/720; 118/723 VE; 118/723 ER; 118/504
(58) Field of Search .............. 204/298.03, 298.04, 204/298.11, 298.16, 298.27, 298.28, 298.29, 192.12, 192.11, 192.13; 427/5, 569, 250.5; 118/712, 719, 720, 723 VE, 723 ER, 729, 733, 504

(56) References Cited

U.S. PATENT DOCUMENTS

| | | | |
|---|---|---|---|
| 3,576,729 A | 4/1971 | Sigournay et al. | .......... 204/192 |
| 3,635,811 A | 1/1972 | Lane | .......... 204/192 |
| 3,829,373 A | 8/1974 | Kuehnle | .......... 204/298 |
| 4,128,466 A | 12/1978 | Harding et al. | .......... 204/192 C |
| 4,142,958 A | 3/1979 | Wei et al. | .......... 204/192 P |

(List continued on next page.)

FOREIGN PATENT DOCUMENTS

| | | | |
|---|---|---|---|
| DE | 19513918 C1 | 11/1996 | ............ C23C/14/22 |
| EP | 0 269 446 | 6/1988 | ............ C23C/14/32 |
| JP | 6-41733 | * 2/1994 | ............ C23C/14/34 |

OTHER PUBLICATIONS

Arnold, S.M. et al., "Ion Beam Sputter Deposition of Low Loss Al2O3 Films For Integrated Optics" Thin Solid Films, 165 (1988) 1–9, Lausanne, Switzerland.

Bricault, R.J. et al., "Deposition of Boron Nitride Thin Films By Ion Beam Assisted Deposition", Nuclear Instructions and Methods in Physics Research B21 (1987) 586–587, Amsterdam.

PCT Search Report for PCT Application PCT/US01/21517, mailed Feb. 4, 2002.

PCT Search Report for PCT Application PCT/US01/21516, mailed Feb. 4, 2002.

Primary Examiner—Steven H. VerSteeg
(74) Attorney, Agent, or Firm—Kurt Rauschenbach; Rauschenbach Patent Law Group

(57) ABSTRACT

A differentially pumped deposition system is described that includes a deposition source, such as a magnetron sputtering source, that is positioned in a first chamber. The deposition source generates deposition flux comprising neutral atoms and molecules. A shield that defines an aperture is positioned in the path of the deposition flux. The shield passes the deposition flux though the aperture and substantially blocks the deposition flux from propagating past the shield everywhere else. A substrate support is positioned in the second chamber adjacent to the shield. The pressure in the second chamber is lower than a pressure in the first chamber. A dual-scanning system scans the substrate support relative to the aperture with a first and a second motion, thereby improving uniformity of the deposited thin fill.

42 Claims, 6 Drawing Sheets

U.S. PATENT DOCUMENTS

| | | |
|---|---|---|
| 4,151,059 A | 4/1979 | Kuehnle ................. 204/192 R |
| 4,197,814 A | 4/1980 | Takagi et al. ............... 118/726 |
| 4,217,855 A | 8/1980 | Takagi ....................... 118/719 |
| 4,392,931 A | 7/1983 | Maniv et al. ........... 204/192 R |
| 4,424,103 A | 1/1984 | Cole ...................... 204/192 R |
| 4,622,919 A | 11/1986 | Suzuki et al. .............. 118/718 |
| 4,675,096 A | 6/1987 | Tateishi et al. ............. 204/298 |
| 4,692,233 A | 9/1987 | Casey ........................ 204/298 |
| 4,693,803 A | 9/1987 | Casey et al. ................ 204/298 |
| 4,777,908 A | 10/1988 | Temple et al. ............... 118/719 |
| 4,793,908 A | 12/1988 | Scott et al. ............ 204/192.26 |
| 4,795,656 A | 1/1989 | Mizoguchi et al. ........... 427/38 |
| 5,240,583 A | 8/1993 | Ahonen ................. 204/298.04 |
| 5,356,673 A | 10/1994 | Schmitt et al. .............. 427/446 |
| 5,536,324 A | 7/1996 | Fuchita ....................... 118/726 |
| 5,571,332 A | 11/1996 | Halpern ................ 118/723 HC |
| 5,594,231 A | 1/1997 | Pellicori et al. ............. 235/462 |
| 5,798,027 A | 8/1998 | Lefebvre et al. ....... 204/192.26 |

\* cited by examiner

DIFFERENTIALLY-PUMPED MATERIAL PROCESSING SYSTEM

RELATED APPLICATIONS

This application claims priority to provisional patent application Serial No. 60/266,114, filed on Feb. 2, 2001, the entire disclosure of which is incorporated herein by reference. This application is also related to provisional patent application Serial No. 60/217,049, filed on Jul. 10, 2000, the entire disclosure of which is incorporated herein by reference.

FIELD OF THE INVENTION

The present invention relates generally to thin film deposition and etching systems. In particular, the present invention relates to methods and apparatus for depositing thin films with very high uniformity. The present invention also relates to methods and apparatus for etching material at highly uniform etch rates.

BACKGROUND OF THE INVENTION

There are three common techniques used to deposit thin films onto substrates. These techniques are evaporation, ion beam deposition, and magnetron sputtering. FIG. 1 illustrates a schematic diagram of a prior art electron beam evaporation deposition system 10. The evaporation system 10 is enclosed in a vacuum chamber 12. An electron gun 14 generates an electron beam 16 that is used to heat a crucible 18 containing the deposition material to a temperature that causes the deposition material to evaporate. The electron beam is deflected with a magnet 20 that causes the electron beam to strike the desired location in the crucible 18. Typical evaporation systems have multiple crucibles.

Some Evaporation systems include multiple sources and multiple electron guns that produce deposition material from two or more sources and deposit the deposition material simultaneously onto a substrate. Alternatively, a thermal heating element (not shown) is used to heat the crucible 18. A substrate support 22 that typically supports multiple substrates 23 is positioned in the path of the evaporated material. In some known evaporation systems, the substrate support 22 is rotated with a motor 24 in order to increase the uniformity of the deposited thin film.

FIG. 2 illustrates a schematic diagram of a prior art ion beam sputter deposition system 50. The ion beam sputter deposition system 50 is enclosed in a vacuum chamber 52. An ion source 54 generates an ion beam 56 that is directed to one or more targets 58. The ion beam 56 strikes the target 58 and sputters neutral atoms from the target 58 with a stutter flux 60. A substrate support 62 that typically supports multiple substrates 64 is positioned in the path of the sputter flux 60. The sputter flux 60 bombards the substrates, thereby depositing a sputtered thin film. In order to increase the uniformity of the sputtered thin film, the substrate support 62 may be rotated with a motor 66. Ion beam sputtering is advantageous because it permits independent control over the energy and current density of the bombarding ions.

FIG. 3 illustrates a schematic diagram of a prior art magnetron sputter deposition system 80. The magnetron sputter deposition system 80 is enclosed in a vacuum chamber 82. The magnetron sputter deposition system 80 includes a diode device having an anode 84 and a cathode 86. A magnet 88 is positioned behind the cathode 86. Two ring-shaped cathodes and a disk-shaped anode are shown, but there are several other known configurations.

The cathode 86 is biased to a negative potential that is high enough to induce a breakdown in the surrounding gas and to sustain a plasma 90. The magnet 88 generates a magnetic field 92 behind the cathode 86 that traps electrons generated by the cathode 86. The electrons lose energy in spiral paths in the plasma 90 and are collected by the anode 84. The electrons enhance the bombarding efficiency of ions 94 in the plasma 90. Neutral atoms 96 are sputtered fit the cathode 86 with a sputter flux 98. The sputter flux 98 bombards the substrates 64, thereby depositing a sputtered thin film onto the substrate 64.

The substrates 64 in known systems are typically placed at a distance from the cathode 86 ranging between two and ten inches. In order to increase the uniformity of the sputtered film, the substrate support 62 may be rotated with a motor 66. Magnetron sputtering is advantageous because it has relatively high deposition rates, large deposition areas, and low substrate heating.

The deposition thickness uniformity achieved with these known techniques is limited by the flux uniformity achieved at the substrate plane and the type of substrate rotation. The flux uniformity can be adversely affected by target or deposition material imperfections that cause hot and cold spots, which affect the deposition rate. Typically, the flux uniformity changes with time. The flux uniformity can be improved somewhat by using a large target and/or by using a long distance from the target to the substrate. However, there are practical limits to the size of the target and the distance from the target to the substrate. Some applications, such as optical filters for high-speed optical communication systems, require thin film uniformities that cannot be achieved with these prior art techniques.

SUMMARY OF THE INVENTION

The present invention relates to methods and apparatus for depositing thin films using a differentially-pumped deposition source and deposition chamber, where the pressure in the deposition source is substantially higher than the pressure in the deposition chamber. The present invention also relates to methods and apparatus for using an ion source that generates an ion beam for ion beam assisted processing of the deposited thin films. In one embodiment, the ion beam and the deposition flux do not overlap and the ion beam is used for out-of-phase ion-beam-assisted processing. Both the deposition source and the ion beam source can be positioned a relatively short distance from the substrate, thereby exposing the substrate to a relatively high density of sputter flux and ion beam flux.

One embodiment of the deposition system of the present invention is a differentially-pumped magnetron sputtering system. The magnetron sputtering system has numerous advantages over known deposition systems. For example, the magnetron sputtering system deposits high purity, high-density films at high deposition rates with a high degree of uniformity and run-to-run consistency. In addition, the magnetron sputtering system has a long target lifetime and is relatively easy to maintain. Thin film uniformity can be improved by aperturing sputter flux from the sputter deposition source and then moving the substrates relative to the sputter flux with a dual-scan motion, such as a two dimensional motion. Thin film uniformity can also be improved by scanning one motion much faster than the other motion. Also, thin film uniformity can be improved by over-scanning.

Accordingly, the present invention features a differentially pumped deposition system that includes a deposition source that is positioned in a first chamber. In one embodiment, the deposition source is a magnetron sputter source. In another embodiment, the deposition source is an evaporation source. The deposition source generates deposition flux comprising neutral atoms and molecules.

A shield defines an aperture that is positioned in a path of the deposition flux. The shield passes the deposition flux through the aperture and substantially blocks the deposition flux from propagating past the shield everywhere else. The aperture may be shaped to increase the transmitted deposition flux. The aperture may also be shaped to reduce the over-scan area. A substrate support is positioned in a second chamber adjacent to the shield. The pressure in the second chamber is lower than the pressure in the first chamber.

The deposition system also includes a dual-scanning system that scans the substrate support relative to the aperture with a first and a second motion. The dual-scanning system may be a mechanical scanning system. The scan rate of the first motion. maybe substantially greater than the scan rate of the second motion The scan rate of at least one of the first motion and the second motion may also vary with time during deposition. In one embodiment the dual-scanning system comprises a rotational scanning system and a translational scanning system, wherein the first motion comprises a rotational motion having a rotation rate and the second motion comprises a translational motion having a translation rate. The rotation rate of the rotational motion may be at least five times greater than the translation rate of the translational motion.

The deposition system may include an ion source that generates an ion beam. The ion source is positioned in the second chamber so that the ion beam strikes the deposition area. The ion source may be positioned so that the ion beam does not overlap with the deposition flux. In addition, the deposition system may include an in-situ monitoring system that monitors properties of the thin film during deposition.

The present invention also features a method of depositing a uniform thin film that includes generating deposition flux at a first pressure. A substrate at a second pressure, which is lower than the first pressure, is exposed to the deposition flux. The deposition flux may be generated by magnetron sputtering. In one embodiment, the deposition flux is passed through an aperture. In one embodiment, the substrate is exposed to an ion beam. The ion beam may overlap with the deposition flux and may be used for in-phase ion beam processing. Also, the ion beam may not overlap with the deposition flux and may be used for out-of phase ion beam processing.

The substrate is scanned relative to the deposition flux with a first and a second motion. The dual-scanning motion improves the uniformity of the thin film. The scan rate of the first motion is greater than the scan rate of the second motion. In one embodiment, the first motion is a rotational motion having a rotational scan rate and the second motion is a translational motion having a translational scan rate. The rotational rate of the rotational motion may be at least five times greater than the translational scan rate. In one embodiment, the substrate is over-scanned relative to the deposition flux in at least one of the firs motion and the second motion.

The present invention also features an ion beam assisted deposition system that includes a deposition source that is positioned in a first chamber. A deposition source generates deposition flux comprising neutral atoms and molecules. The deposition source may be a magnetron sputter source. The ion source is positioned so that the ion beam does not overlap with the deposition flux.

A substrate support is positioned in a second chamber. The pressure in the second chamber is lower than the pressure in the first chamber. An ion source is positioned in the second chamber so that the ion beam strikes a deposition area on the substrate support. The ion source generates an ion beam that is used for ion beam assisted processing.

A dual-scanning system scans the substrate support relative to the aperture with a first and a second motion. The scan rate of the first motion is substantially greater than the scan rate of the second motion. The scan rate of at least one of the first motion and the second motion may vary with time during deposition. The dual-scanning system includes a rotational scanning system that scans the substrate support at a rotation rate and a translational scanning system that scans the substrate support relative to the aperture at a translational rate. The rotation rate of the rotational motion may be at least five times greater than the translation rate of the translational motion.

In one embodiment, the deposition system includes a shield that defines an aperture that is positioned in the pat of the deposition flux. The shield passes the deposition flux through the aperture and substantially blocks the deposition flux from propagating past the shield everywhere else. The aperture may be shaped to increase the transmitted deposition flux. The aperture may also be shaped to reduce the over-scan area. In one embodiment, the dual-scanning system includes an in-situ monitoring system that monitors properties of the thin film during deposition.

The present invention also features a method of out-of-phase ion beam assisted deposition. The method includes generating deposition flux at a first pressure. The deposition flux may be generated by magnetron sputtering. The deposition flux is deposited onto a substrate at a second pressure. The second pressure is lower than the first pressure. The substrate is exposed to an ion beam that does not overlap with the deposition flux.

In one embodiment, the substrate is scanned relative to the deposition flux with a first motion and a second motion. The dual-scan motion deposits a uniform thin film onto the substrate. In one embodiment, the first motion is a rotational motion having a rotational scan rate and the second motion is a translational motion having a translational scan rate. The scan rate of the first motion may be greater than the scan rate of the second motion. The rotational rate of the rotational motion may be at least five times greater than the translational scan rate.

In one embodiment, the deposition flux is passed through an aperture. In one embodiment, the substrate is over-scanned relative to the deposition flux in at least one of the first motion and the second motion.

BRIEF DESCRIPTION OF THE DRAWINGS

This invention is described with particularity in the appended claims. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
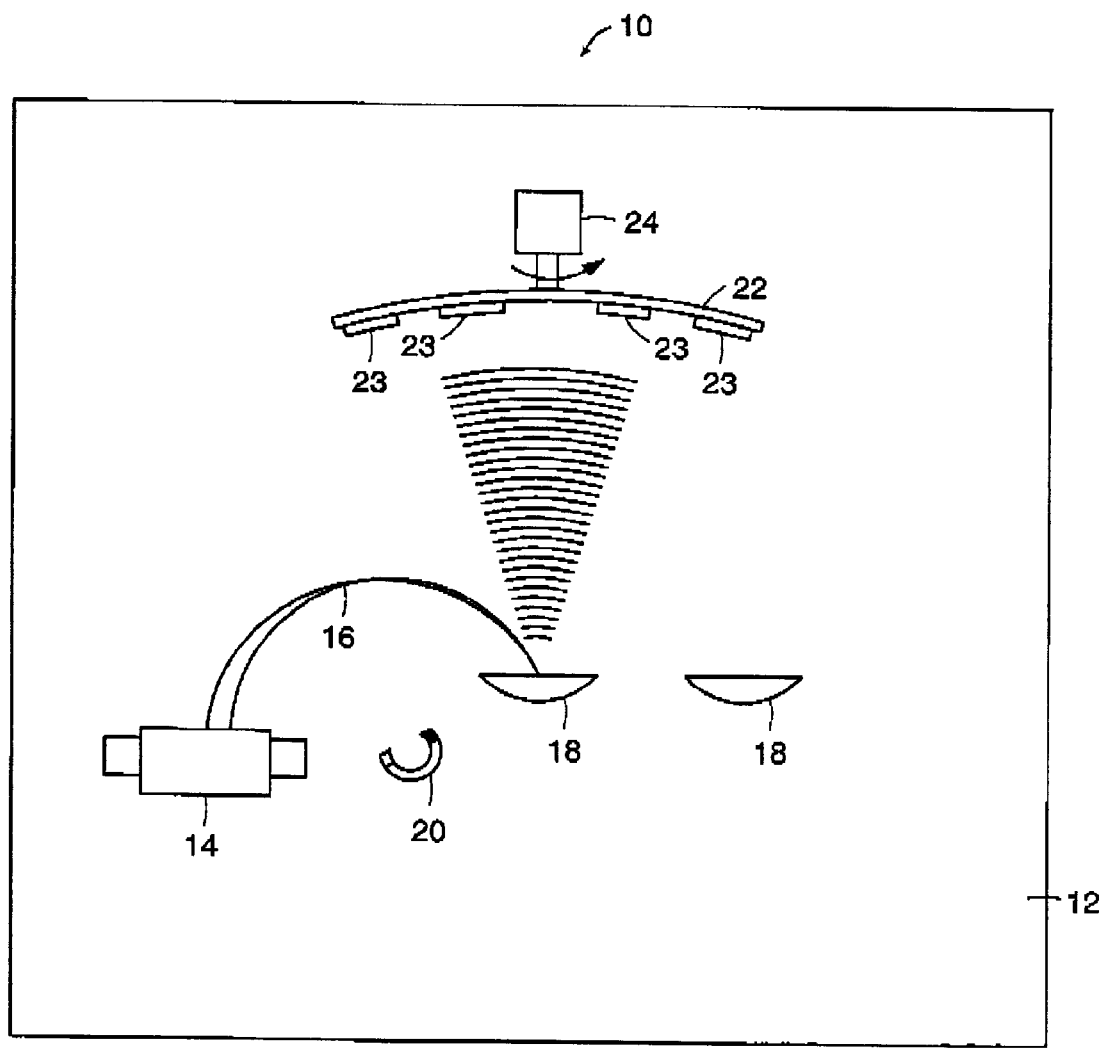
FIG. 1 illustrates a schematic diagram of a prior art electron beam evaporation deposition system.
Figure 2:
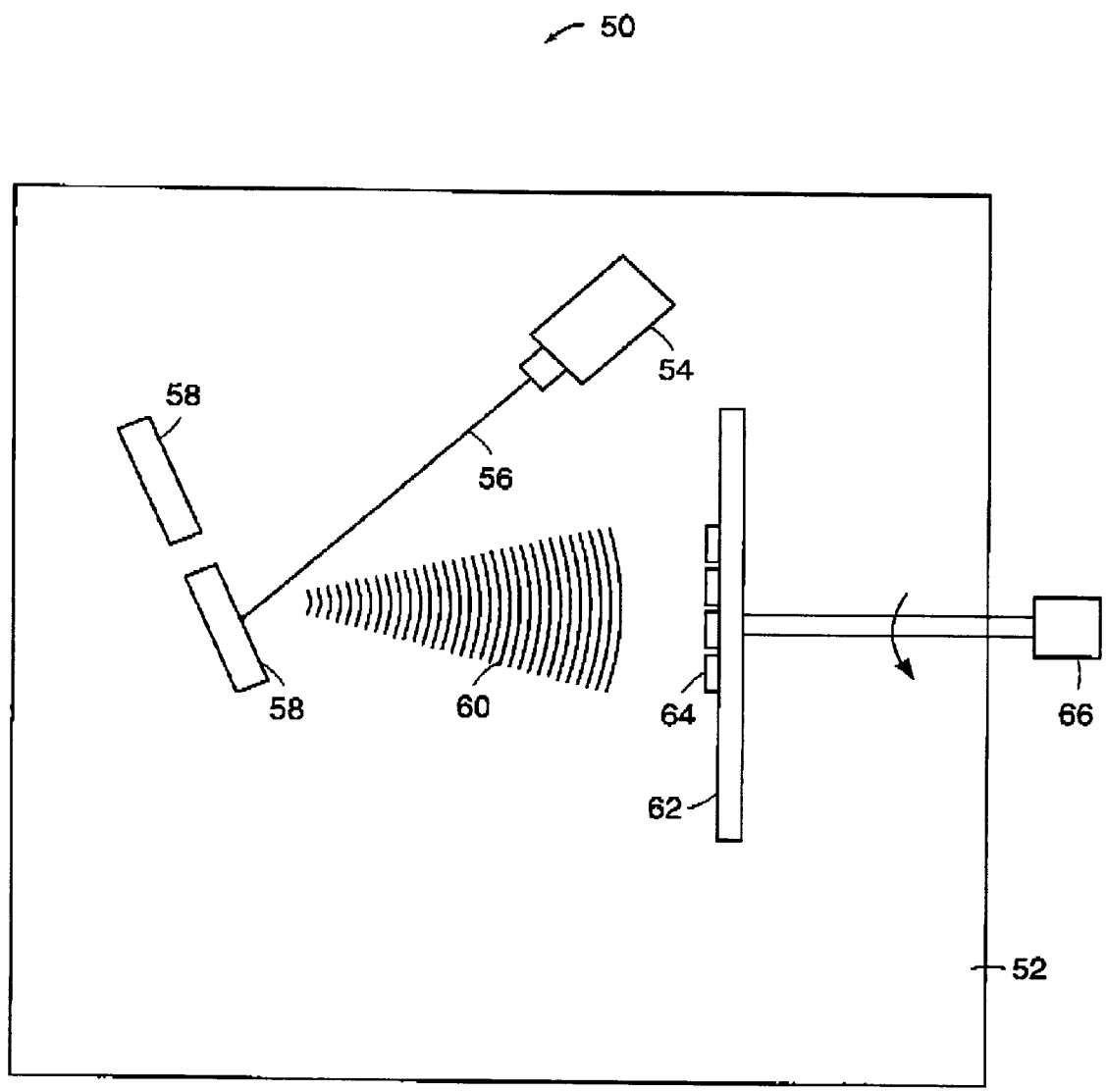
FIG. 2 illustrates a schematic diagram of a prior art ion beam sputter deposition system.
Figure 3:
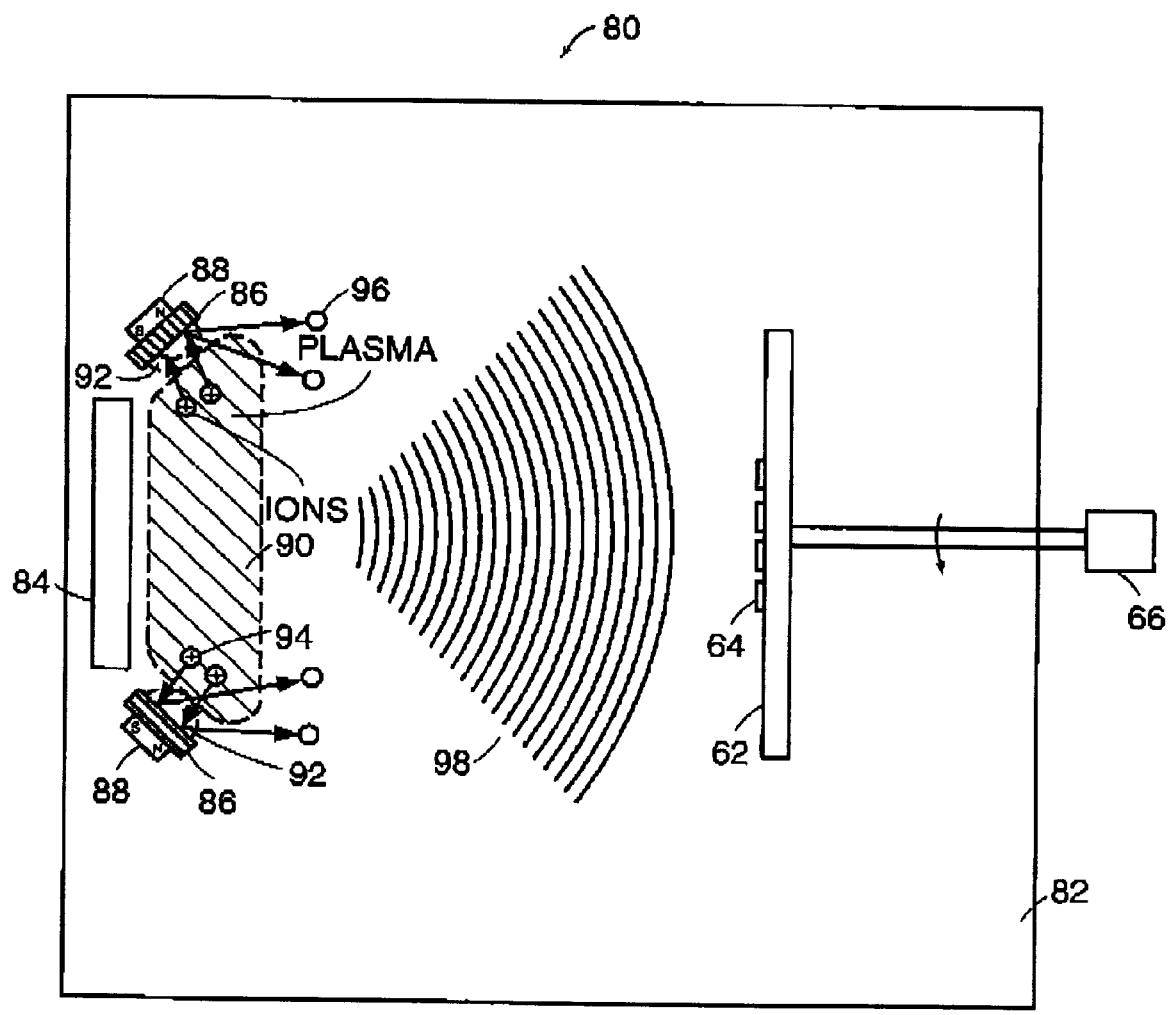
FIG. 3 illustrates a schematic diagram of a prior art magnetron sputter deposition system.

There are many devices that require highly uniform thin film coatings. For example, optical filters for some applications, such as optical fiber communication systems, may require multiple layers of highly uniform thin films where each layer has a precise thickness. Optical fiber communication systems are now widely deployed. Recently, new communications services, such as the Internet, high-speed data links, video services, and wireless services have resulted in a dramatic increase in the need for bandwidth. Data traffic is currently increasing at a rate of 80% per year and voice traffic is currently increasing at a rate of 10% per year.

One way of increasing bandwidth in optical fiber communications system is to increase the number of wavelengths of light propagating in the optical fiber. Wavelength division multiplexing (WDM) is an optical transport technology that propagates many wavelengths in the same optical fiber, thus effectively increasing the aggregate bandwidth per fiber to the sum of the bit rates of each wavelength. Bandwidths greater than 1 terabits/sec have been demonstrated in WDM based communication systems.

Dense Wavelength Division Multiplexing (DWDM) is a technology that implements WDM technology with a large number of wavelengths. DWDM is typically used to describe WDM technology that propagates more than 40 wavelengths in a single optical fiber. As the number of wavelengths increases, the channel width and channel spacing decreases. To achieve the required channel width and channel spacing in DWDM communication systems, high quality, high performance optical filters are required. These optical filters must exhibit low loss and narrow band transmission characteristics over the wavelength spectrum of 1.3 µm to 1.55 µm with good mechanical properties, which are stable in typically operating environments.

DWDM communication systems require many band-pass filters that can separate a single wavelength (channel) from the other wavelengths (channels) propagating in the system. One type of optical filter that is used as a bandpass filter in DWDM communication systems is a Fabry Perot interference filter. Fabry Perot filters comprise two high-reflectance multilayers separated by a λ/2 layer. In operation, multiple interferences in the λ/2 space layer cause the filter output spectral characteristic to peak sharply over a narrow band of wavelengths that are multiples of the λ/2 space layer.

Another type of optical filter used in DWDM communication systems is a dielectric thin film interference filter. These filters comprise alternate layers of high refractive index low refractive index material. Each layer is a λ/4 tick. In operation, light reflected from high index layers does not experience a phase shift, but light reflected from the low index layers does experience a 180 degree phase shift. Successive reflections recombine constructively at the front face producing a highly reflected beam having a narrow wavelength range. Light having wavelengths outside of this narrow range is reflected at only very low intensity levels.

A dielectric thin film interference filter can be fabricated by depositing alternating layers of high and low refractive index material onto a glass substrate. For example, alternating layers of $SiO_2$ and $Ta_2O_5$ can be used. The refractive index and the uniformity across the filter must be controlled to a very high precision in order to achieve the desired filter characteristics.

Figure 4:
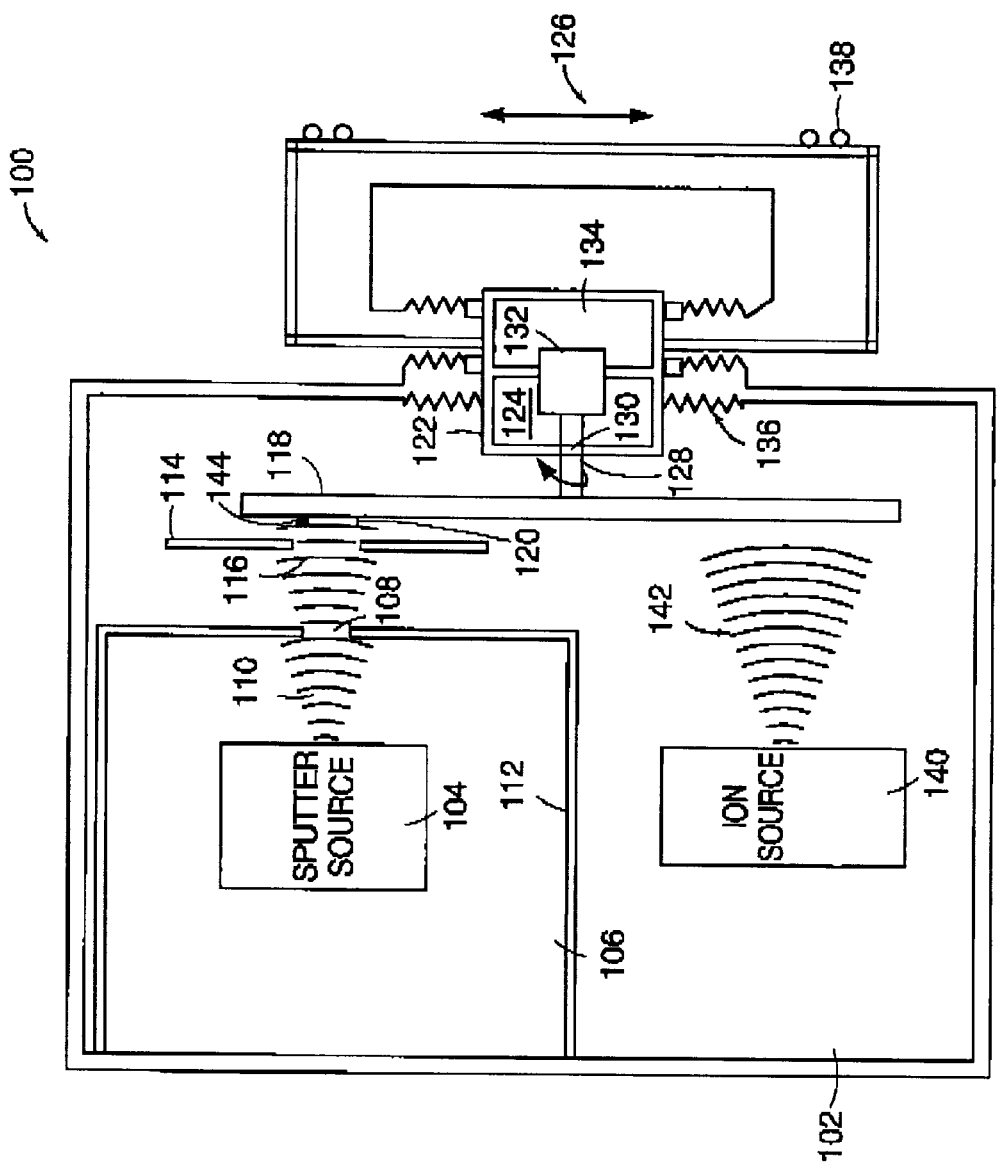
FIG. 4 illustrates a schematic diagram of a differentially-pumped deposition system according to the present invention.

FIG. 4 illustrates a schematic diagram of a differentially-pumped deposition system 100 according to the present invention. In one embodiment, the deposition system 100 is a sputter deposition system. However, any type of deposition system can be used according to the present invention. Sputter deposition is a particularly versatile deposition technique. Thin films containing almost every element in the periodic table have been deposited by sputter deposition. Alloys and compounds can generally be sputter-deposited into thin films that maintain the composition of the target material. In addition, compositions can be controlled to relatively high accuracy.

The differentially-pumped deposition system 100 includes a deposition chamber 102 that maintains a pressure suitable for depositing material onto substrates. The system 100 also includes a deposition source 104. The deposition source may be any type of deposition source. In one embodiment, the deposition source 104 is a sputter deposition source 104. The sputter deposition source 104 may be a multi-target sputter deposition source. The sputter deposition source 104 may also include multiple sputter deposition sources that sputter two or more materials. Multi-target or multi-source sputter deposition sources are used for depositing multi-layer thin films onto substrates.

In one embodiment, the deposition source 104 is an ion beam sputter deposition source. In another embodiment, the deposition source 104 is a magnetron sputter deposition source. Magnetron sputter deposition sources include a diode device, a magnet, and a target. The sputter target is biased to a negative potential that is high enough to induce a breakdown in the surrounding gas and to sustain a plasma. The magnet is used to generate a magnetic field behind the target in order to trap electrons and thereby enhance the bombarding efficiency of the ions. Magnetron sources are advantageous because they generate a relatively high sputter flux. Also, magnetron sputter sources can be used for large area depositions and typically cause relatively little substrate heating.

The deposition source 104 is positioned inside a deposition source enclosure 106. The position source enclosure 106 is a separate chamber that includes an aperture 108, which passes a desired portion of deposition flux 110 into the deposition chamber 102. The source enclosure 106 maintains a pressure that is substantially independent of the pressure of the deposition chamber 102. The area of the aperture 108 is selected to maintain the desired differential pressure between the deposition source enclosure 106 and the deposition chamber 102.

In one embodiment, the deposition system 100 includes multiple deposition source enclosures that are mounted on a rotating shaft as described in connection with FIG. 5. Each of the multiple deposition enclosures includes a deposition source that comprises a sputter target that has a different material or a different material composition. Including multiple deposition source enclosures is useful for depositing multi-layer thin films.

One advantage of using a separate deposition source enclosure 106 in the deposition system 100 is that undesirable material deposition resulting from the deposition is substantially contained within the deposition source enclosure 106. This feature maintains the cleanliness of the deposition chamber 102 and, therefore, reduces the required maintenance that must be performed on the deposition chamber 102. Also, the deposition source enclosure 106 can be cleaned separately from the deposition chamber 102, which also reduces the required maintenance that must be performed on the deposition chamber 102. The inside surface 112 of the deposition source enclosure 106 may be roughened by, for example, bead-blasting to facilitate removal of unwanted deposition material.

Another advantage of using a separate deposition source enclosure 104 in the deposition system 100 is that the pressure inside the deposition source enclosure 104 can be substantially higher than the pressure in the deposition chamber 102. The pressure differential may be on order of a factor of ten. For example, the pressure in the deposition source enclosure 106 may be on the order of $2-5 \times 10^{-3}$ Torr and the pressure in the deposition chamber 102 may on the order of $2-5 \times 10^{-4}$.

Maintaining the deposition source enclosure 106 at a relatively high pressure compared with the substrates is advantageous because the deposition source 104 will generate a relatively high deposition flux. Also, the material deposited on the substrates will have relatively high purity because the relatively low background pressure results in reduced undesirable impurities and contamination. In particular, maintaining the deposition source enclosure 106 at a higher pressure than the deposition chamber 102 will result in a relativly low concentration of Argon in the deposited thin film.

The deposition system 100 includes a shield 114 that defines an aperture 116 that is positioned in the path of the deposition flux 110. The shield 114 may be positioned a few inches or less from the deposition source 104. The shield 114 passes deposition flux 110 through the aperture 116 and substantially blocks the deposition flux 110 from propagating past the shield 114 everywhere else. The aperture 116 spatially defines the deposition flux 110 that reaches the substrates.

A substrate support 118 is positioned proximate to the aperture 116 defined by the shield 114 in the path of the deposition flux 110. The substrate support 118 may be positioned a few inches or less from the shield 114 and from the aperture 108 in the deposition source enclosure 106. Positioning the substrate support 118 in close proximity to the deposition source 104 is advantageous because relatively high-density deposition flux 110 will reach the substrates and, therefore, the deposition rate will be relatively high. In one embodiment, the substrate support 118 comprises a disk. The substrate support 118 holds multiple substrates 120, but may hold only one substrate 120 in some applications.

The deposition system 100 also includes a dual-scanning system 122. By dual-scan system we mean a scanning system that scans the substrate support 118 relative to the aperture 108 with a first and a second motion. The first and the second motion may be any type of motion, such as translational or rotational motion. The first and the second type of motion may be the same or a different types of motion. For example, in one embodiment, the dual-scanning system 122 scans with a translational and a rotational motion. In another embodiment, the dual-scanning system 122 scans with a first and a second translational motion.

The scan rates of the first and the second motion may be different and independently controllable. The scan rates may be rotation rates or translation rates depending upon the type of motion. In one embodiment, the scan rate of one type of motion is substantially greater than a scan rate of the other type of motion. For example, the scan rate of one type of motion may be five times greater than the scan rate of the other type of motion. In one embodiment, the scan rate of at least one of the first and second types of motion varies with time during deposition.

The dual-scanning system 122 may be any type of scanning system that scans the substrate support 118 relative to the aperture 108 with two motions. In one embodiment, the dual scanning system 122 includes a rotational scanning system 124 and a translational scanning system 126. The rotational scanning system 124 includes a shaft 128 that is rotationally attached to the substrate support 118 and that is positioned through a vacuum feed through 130.

The shaft 128 is rotated by a motor 132 at a rotation rate. In one embodiment, the motor 132 rotates the shaft 128 at a rotation rate that is greater than 1,000 RPMs. The motor 132 may be positioned inside a motor enclosure 134 that is attached to the deposition chamber 102 with a bellows 136. This allows the motor 132 to translate along a surface of the deposition chamber 102. This also allows the motor enclosure 134 to be at atmospheric pressure, which simplifies the deposition system 100 and reduces overall cost.

The translational scanning system 126 includes a linear drive mechanism 138 that translates at least one of the substrate support 118 and the aperture 116 defined by the shield 114 in linear direction at a translation rate. In the embodiment shown in FIG. 4, the linear drive mechanism 138 is coupled to the substrate support 118 and translates the substrate support 118 relative to the aperture 116 defined by the shield 114, which is fixed in position. In other embodiments, the linear drive mechanism 138 is coupled to the shield 114 and it translates the aperture 116 relative to the substrate support 118. In this embodiment, the linear drive mechanism 138 may also be coupled to the deposition source enclosure 106.

In one embodiment, the dual-scanning system 122 is designed to cause very smooth motion in order to maximize the uniformity of the deposited thin films. For example, the dual-scanning system 122 may include air bearing drives that produce very smooth motion which can be precisely controlled.

In one embodiment, the scan rate in one dimension is much faster than the scan rate in the other direction. By much faster, we mean that one scan rate is greater than five times faster than the other scan rate. Using one scan rate that is much faster compared with the other scan rate reduces ripples in the thickness uniformity. For example, the rotation rate may be much faster than the linear translation rate. In one embodiment, the rotational motion is at least five times greater than the translation rate of the translational motion. A high degree of uniformity can be achieved by using a relatively fast rotation rate of approximately 1,000 to 3,000 RPMs and a relatively slow linear scan of approximately 0.5 to 4 inches per second.

In one embodiment, the scan rate of at least one motion is varied during the deposition in order to improve uniformity. The scan rate may be varied as a function of time during the deposition. The scan rate may also be varied as a function of the relative position of the substrate support 118 and the aperture 116 that is defined by the shield 114. For example, varying the scan rate in at least one dimension may be used to at least partially compensate for radial uniformity effects. In some systems, the deposition flux 110 is a function of the radial position from the center of the aperture 116. A constant 1/R scan rate correction may be applied to the linear translation rate to compensate for the radial uniformity effect.

In one embodiment, the scan rate of at least one motion is varied during the deposition in order to produce a thickness variation in the deposited thin film that changes the frequency characteristics of a thin film optical filter. For example, the scan rate may be varied as a function of the relative position of the substrate support 118 and the aperture 116 defined by the shield 114 to simultaneously produce thin film filters that have different center wavelengths. Such a capability is important for high volume manufacturing of thin film filters for DWDM communication systems.

There are numerous other embodiments of the dual-scanning system 122 of the present invention. Any combination of scanning the substrate support 118, the aperture 116, and/or the deposition source enclosure 106 with at least two motions will improve the uniformity according to the present invention. For example, in one embodiment, the substrate support 118 is stationary and the aperture 114 and the deposition source enclosure 106 are scanned with two motions. In another embodiment, the substrate support 118 is scanned with one motion and the aperture 108, or the deposition source enclosure 106, are scanned with another motion.

One advantage of the dual-scanning system 122 of the present invention is that a high degree of uniformity can be obtained where the uniformity is independent of parameters of the deposition source 104, such as the sputter target life cycle. That is, a high degree of uniformity can be obtained regardless of the physical condition of the target.

In one embodiment, the deposition system 100 includes an ion source 140 that generates an ion beam 142 that is used for ion-beam-assisted processing. A gas, such as argon or oxygen, or a mixture of gases, is introduced into the ion source 140. A plasma is generated in the ion source 140. Ions are extracted from the plasma with multi-aperture electrodes and then accelerated. In one embodiment, the ions are accelerated to energies in the range of 100 eV to 500 eV.

The ion source 140 may be positioned a few inches or less from the substrate support 118. Positioning the ion source 140 in close proximity to the substrate support 118 increases the density of the ion beam 142. In one embodiment, the ion source 140 is position relative to the substrate support 118 and the deposition source enclosure 106 so that the ion beam 142 and the deposition flux 110 do not overlap, as shown in FIG. 4. Such a configuration can be used to perform out-of-phase ion-beam-assisted processing, where the ion beam 142 and the deposition flux 110 alternatively strike the substrates 120. That is, for example, the deposition flux 110 strikes the substrates 120 during one portion of the scan and the ion beam 142 strikes the substrates 120 during another (non-overlapping) portion of the scan.

The ion source 140 may be an oxygen ion source that generates an oxygen beam. An oxygen ion source can be used for out-of-phase oxidation. For example, the oxygen ion source can be used to oxidize deposited thin films between multi-layer depositions. Positioning the ion source outside of the deposition chamber has numerous advantages. One advantage is that such an ion source will not cause contamination of the target material, such as oxygen contamination (i.e. unwanted oxidation of the target material), even at relatively high oxygen flow rates.

In one embodiment, the deposition system 100 includes a detector 144 that monitors the deposition flux 110. The detector 144 may be a quartz oscillator that measures thin film thickness and/or deposition rate. In one embodiment, the shield 114 includes a second aperture (not shown) that passes a portion of the deposition flux 110. The detector 144 is positioned behind the second aperture to detect and measure the deposition flux 110. The measurement of the deposition flux 110 can be used to change the parameters of the deposition source 104 for various applications including generating more uniform deposition flux 110. In addition, the measurement of the deposition flux 110 can be used to control the rotation rate of the rotational scanning system 124 and/or the translation rate of the translational scanning system 126.

In one embodiment, the deposition system 100 includes an in-situ thin film monitor having a light source (not shown), such as a tunable laser that generates a single wavelength light beam. The wavelength of the tunable laser is chosen so that the deposition material absorbs a portion of the laser light. The laser propagates through the deposition area and the substrate 120.

A detector is positioned proximate to the back side of the substrate 120. The detector monitors the intensity of light transmitted through the deposition area and the substrate 120. As the film thickness increases, a larger fraction of the light beam is absorbed in the film and thus the detected light beam has a lower intensity. The thickness and the deposition rate can be determined from a measurement of the detected light beam intensity. This information can be used to control the deposition process.

Figure 5:
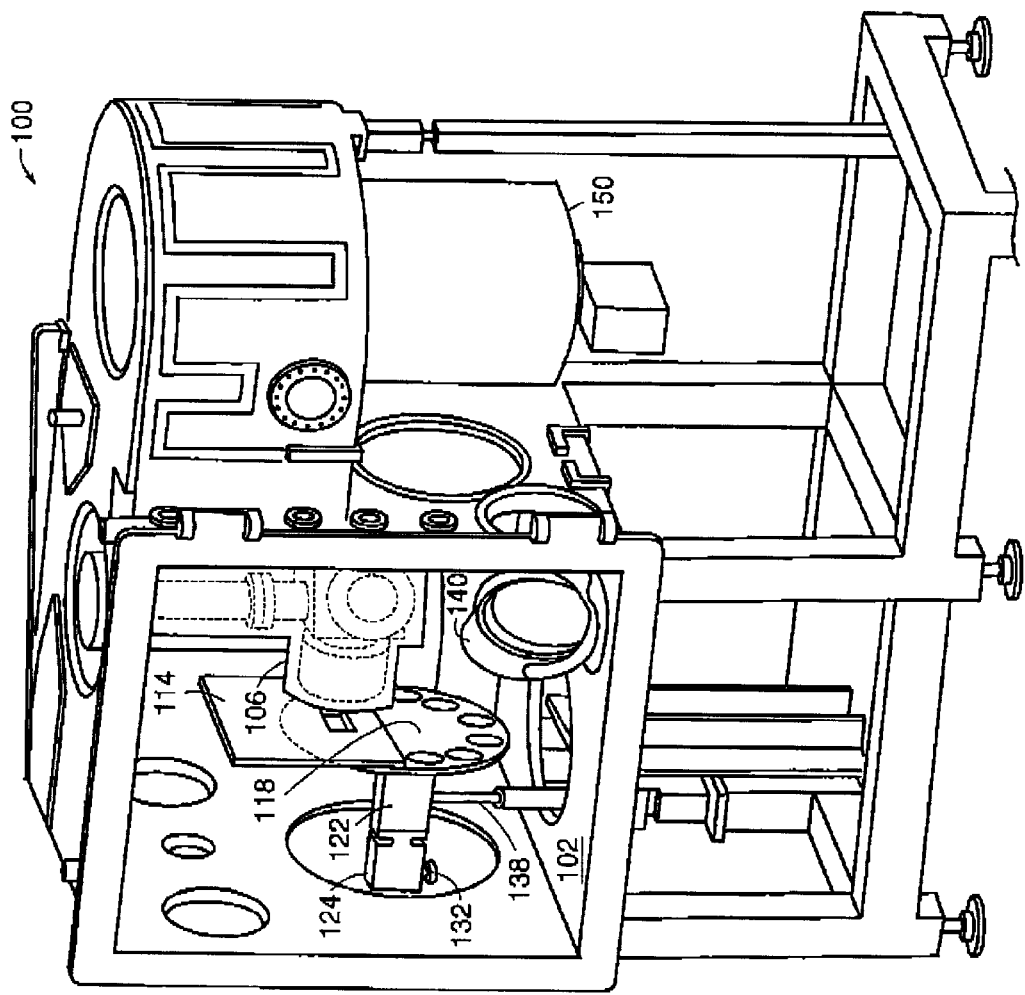
FIG. 5 illustrates a three-dimensional schematic diagram of one embodiment of a differentially-pumped deposition apparatus according to the present invention.

FIG. 5 illustrates a three-dimensional schematic diagram of one embodiment of a differentially-pumped deposition system 100 according to the present invention. The deposition chamber 102 is cut away so that the dual-scanning system 122, substrate support 118, multiple sputter source enclosures 106, and the ion source 140 are visible. FIG. 5 also illustrates a vacuum pump 150 that evacuates the deposition chamber 102.

The dual-scanning system 100 shown in FIG. 5 includes a rotational scanning system 124 having a shaft that is rotationally attached to the substrate support 118. The shaft is rotated by a motor 132. The translational scanning system 122 includes a linear drive mechanism 138 that translates the substrate support 118 at a translation rate.

Figure 6:
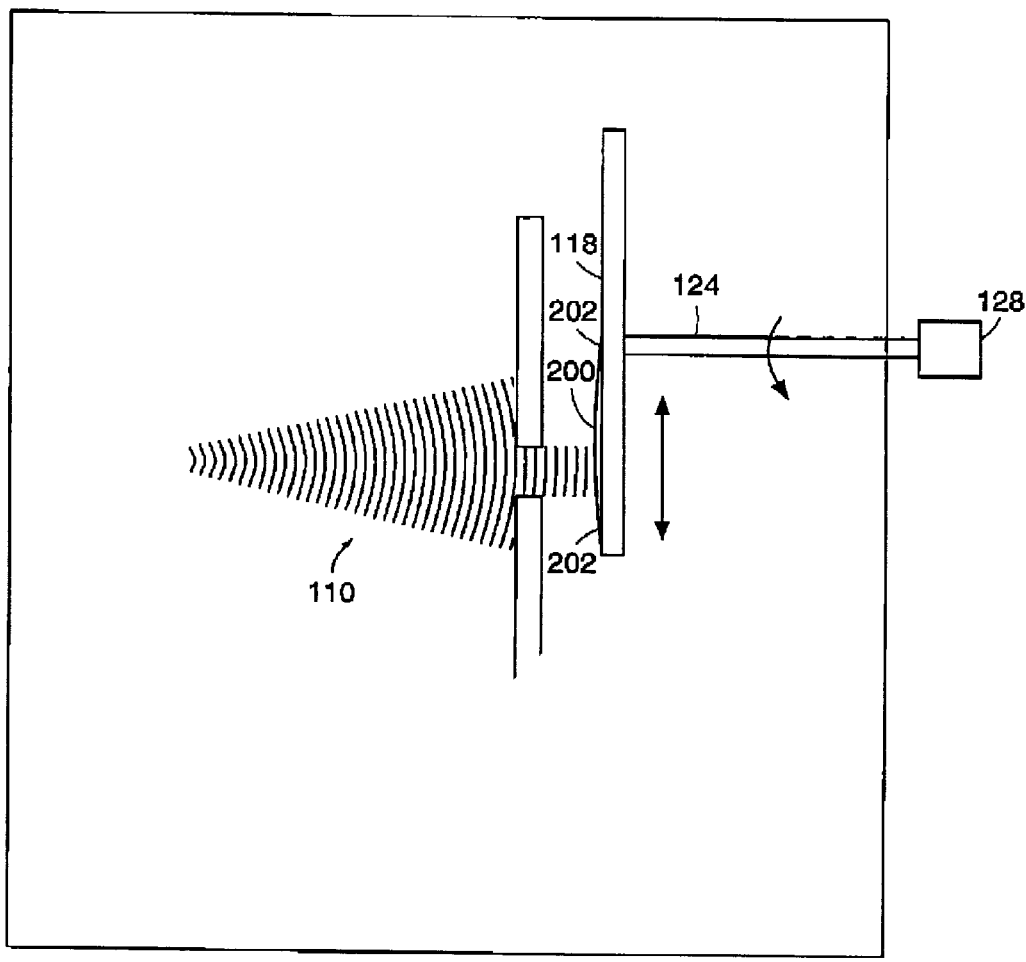
FIG. 6 illustrates a method of over-scanning the substrates using the differentially-pumped deposition apparatus of the present invention.

FIG. 6 illustrates a method of over-scanning a substrate 120 (FIG. 4) using the deposition apparatus of the present invention. The over-scanning method of the present invention improves uniformity of the deposited thin film by extending the scanning dimension to eliminate edge effects. In one embodiment, the desired deposition area 200 (i.e. where a uniform thin film is desired) is in the shape of a circle or a ring. The over-scan area 202 corresponds to the edge of the circle. The over-scan area 202 is the area that corresponds to where the linear drive mechanism 138 (FIG. 4) changes direction.

The method of over-scanning includes translating the linear drive mechanism 138 in the linear direction significantly past the desired deposition area 200 so that the desired deposition area 200 is exposed to an equal amount of sputter flux 110. In one embodiment, plurality of substrates 120 is positioned in the desired deposition area 200. In another embodiment, one large substrate is positioned on the substrate support 118 and the desired deposition area is cleaved or cut from the substrate after the deposition.

Equivalents

While the invention has been particularly shown and described with reference to specific preferred embodiments, it should be understood by those skilled in the art that various changes in form and detail may be made therein without departing from the spirit and scope of the invention as defined by the appended claims. For example, the methods and apparatus for depositing thin films described herein can apply to etching thin films.

What is claimed is:

1. A differentially pumped deposition system comprising:
   a. a deposition source that is positioned in a first chamber, the deposition source generating deposition flux comprising neutral atoms and molecules;
   b. a shield defining an aperture that is positioned in a path of the deposition flux, the shield passing the deposition flux through the aperture and substantially blocking the deposition flux from propagating past the shield everywhere else;
   c. a substrate support that is positioned in a second chamber adjacent to the shield; a pressure in the second chamber being lower than a pressure in the first chamber; and
   d. a dual-scanning system that scans the substrate support relative to the aperture with a rotational motion and a translational motion.

2. The deposition system of claim 1 wherein the deposition source comprises a magnetron sputter source.

3. The deposition system of claim 1 wherein the deposition source comprises an evaporation source.

4. The deposition system of claim 1 further comprising an ion source that generates an ion beam, the ion source being positioned in the second chamber so that the ion beam strikes the deposition area.

5. The deposition system of claim 4 wherein the ion source is positioned so that the ion beam does not overlap with the deposition flux.

6. The deposition system of claim 1 wherein the dual-scanning system comprises a mechanical scanning system.

7. The deposition system of claim 1 wherein a scan rate of the rotational motion is substantially greater than a scan rate of the translational motion.

8. The deposition system of claim 1 wherein a scan rate of at least one of the rotational motion and the translational motion varies with time during deposition.

9. The deposition system of claim 1 wherein the dual-scanning system comprises rotational scanning system and a translational scanning system, wherein the rotational motion comprises a rotation rate and the translational motion comprises a translation rate.

10. The deposition system of claim 9 wherein the rotation rate of the rotational motion is at least five times greater than the translation rate of the translational motion.

11. The deposition system of claim 1 wherein the aperture is shaped to increase a transmitted deposition flux.

12. The deposition system of claim 1 wherein the aperture is shaped to reduce an over-scan area.

13. The deposition system of claim 1 further comprising an in-situ monitoring system that monitors properties of a thin film during deposition.

14. A method of depositing a uniform thin film, the method comprising:
    a. generating deposition flux at a first pressure;
    b. exposing a substrate to the deposition flux, the substrate being at a second pressure, wherein the second pressure is lower than the first pressure; and
    c. scanning the substrate relative to the deposition flux with a rotational motion and a translational motion, wherein a scan rate of the rotational motion is greater than a scan rate of the translational motion, thereby depositing a substantially uniform thin film onto the substrate.

15. The method of claim 14 wherein the rotational motion comprises a rotation rate the translational motion comprises a translation rate.

16. The method of claim 15 wherein the rotation rate of the rotational motion is least five times greater than the translation rate of the translational motion.

17. The method of claim 14 wherein the deposition flux is generated by magnetron sputtering.

18. The method of claim 14 further comprising passing the deposition flux through an aperture.

19. The method of claim 14 further comprising over scanning the substrate relative to the deposition flux in at least one of the rotational motion and the translational motion.

20. The method of claim 14 further comprising exposing the substrate to an ion beam.

21. The method of claim 20 wherein the ion beam does not overlap with the deposition flux.

22. The method of claim 20 wherein the ion beam does overlap with the deposition flux.

23. An ion beam assisted deposition system comprising:
    a. a deposition source that is positioned in a first chamber, the deposition source generating deposition flux comprising neutral atoms and molecules;
    b. a substrate support that is positioned in a second chamber; a pressure in the second chamber being lower than a pressure in the first chamber; and
    c. an ion source that generates an ion beam, the ion source being positioned in the second chamber so that the ion beam strikes a deposition area on the substrate support.

24. The deposition system of claim 23 wherein the deposition source comprises a magnetron sputter source.

25. The deposition system of claim 23 wherein the ion source is positioned so that the ion beam does not overlap the deposition flux.

26. The deposition system of claim 23 further comprising a dual-scanning system that scans the substrate support relative to the deposition flux with a rotational motion and a translational motion.

27. The deposition system of claim 26 wherein a scan rate of the rotational motion is substantially greater than a scan rate of the translational motion.

28. The deposition system of claim 26 wherein a scan rate of at least one of the rotational motion and the translational motion varies with time during deposition.

29. The deposition system of claim 26 wherein the dual-scanning system comprises a rotational scanning system that scans the substrate support at a rotation rate and a translational scanning system that scans the substrate support at a translation rate.

30. The deposition system of claim 29 wherein the rotation rate of the rotational motion is at least five times greater than the translation rate of the translational motion.

31. The deposition system of claim 23 further comprising an in-situ monitoring system that monitors properties of the deposition area during deposition.

32. The deposition system of claim 23 further comprising a shield that defines an aperture that is positioned in a path of the deposition flux, the shield passing the deposition flux through the aperture and substantially blocking the deposition flux from propagating past the shield everywhere else.

33. The deposition system of claim 32 wherein the aperture is shaped to increase the transmitted deposition flux.

34. The deposition system of claim 32 wherein the aperture is shaped to reduce an over-scan area.

35. A method of out-of-phase ion beam assisted deposition, the method comprising:

a. generating deposition flux at a first pressure;

b. depositing the deposition flux onto a substrate at a second pressure, wherein the second pressure is lower than the first pressure; and c. exposing the substrate to an ion beam, wherein the ion beam does not overlap with the deposition flux.

36. The method of claim 35 wherein the deposition flux is generated by magnetron sputtering.

37. The method of claim 35 further comprising scanning the substrate relative to the deposition flux with first motion and a second motion.

38. The method of claim 37 wherein a scan rate of the first motion is greater than a scan rate of the second motion, thereby depositing a uniform thin film onto the substrate.

39. The method of claim 37 wherein the first motion is a rotational motion having a rotation rate and the second motion is a translational motion having a translation rate.

40. The method of claim 39 wherein the rotation rate of the rotational motion is least five times greater than the translation rate.

41. The method of claim 37 further comprising overscanning the substrate relative to the deposition flux in at least one of the first motion and the second motion.

42. The method of claim 35 further comprising passing the deposition flux through an aperture.

* * * * *

UNITED STATES PATENT AND TRADEMARK OFFICE
CERTIFICATE OF CORRECTION

PATENT NO. : 6,495,010 B2
DATED : December 17, 2002
INVENTOR(S) : Piero Sferlazzo It is certified that error appears in the above-identified patent and that said Letters Patent is hereby corrected as shown below:

Column 11,
Line 42, replace "rotational" with -- a rotational --

Column 14,
Line 6, replace "least" with -- at least --

Signed and Sealed this

Eleventh Day of March, 2003

JAMES E. ROGAN
*Director of the United States Patent and Trademark Office*